Oct. 12, 1965 L. BERNSTEIN 3,211,595

P-TYPE ALLOY BONDING OF SEMICONDUCTORS
USING A BORON-GOLD ALLOY
Filed Nov. 2, 1959

LEONARD BERNSTEIN,
INVENTOR

BY Charles J. Haughey
ATTORNEY

United States Patent Office 3,211,595
Patented Oct. 12, 1965

3,211,595
P-TYPE ALLOY BONDING OF SEMICONDUCTORS USING A BORON-GOLD ALLOY

Leonard Bernstein, Fullerton, Calif., assignor to Hughes Aircraft Company, Culver City, Calif., a corporation of Delaware Filed Nov. 2, 1959, Ser. No. 850,348
7 Claims. (Cl. 148—185)

This invention relates to bonding alloys for semiconductor device fabrication; and more particularly to ductile boron-gold alloys therefor.

Gold is a well-known bonding alloy for semiconductor device fabrication, and particularly for bonding electrically conducting leads and tabs to silicon and germanium devices. It has very high corrosion resistance to etchants of the nitric acid and hydrofluoric acid type often used in cleaning and etching semiconductor devices; and it also forms binary eutectics with silicon and germanium at temperatures of 370° and 356° centigrade, respectively, at which temperatures alloy bonding steps may be carried out, and which are sufficiently high to produce temperature resistant bonds. It is also highly malleable, and is thus easily mechanically formed into a variety of shapes.

Gold is used as a bonding alloy in a multiple heating step process wherein a p-type dopant, or impurity, such as aluminum, is first coated on and fused into a semiconductor crystal, and a lead is subsequently fused to the aluminum by use of gold as a bonding alloy. Unless the gold contains a dopant material which will increase the dopant or active impurity concentration in the semiconductor crystal adjacent a lead attached thereto, reliable and satisfactory lead attachments are not obtained. The low distribution coefficients of p-type dopants other than boron have accordingly sometimes necessitated the use of a two-step heating process for p-type bonding, first to fuse a p-type dopant, such as aluminum, to a semiconductor, then reheat with gold to bond an electrically conducting lead thereto.

Boron is a well known dopant material in the semiconductor art, for producing p-type semiconductor regions, and due to its high distribution coefficient a high proportion of the boron dissolved in a silicon or germanium melt will be retained in the regrown crystal when it solidifies. Boron is also a relatively light atom, atomic number 5, and is presently preferred as a p-type dopant for semiconductor crystals over other p-type dopants such as aluminum, gallium and indium.

In the light of the desirable properties of gold as a bonding material, and of boron as a dopant, or type determining impurity, for semiconductor device fabrication, a boron-containing gold alloy has been long sought, but such an alloy has heretofore been unknown and notoriously unavailable. "Constitution of Binary Alloys," by Hansen, McGraw Hill Book Company (1958) notes on page 186 that attempts to cementate gold with boron were negative.

It is an object of this invention to produce alloys suitable for semiconductor device fabrication, which are useful as bonding materials and sources of p-type active impurities, and to produce predetermined shapes and tabs or leads clad with such alloys for bonding leads and supports to semiconductor devices, with ohmic or rectifying junctions or connections being produced.

It is a particular object of this invention to produce a gold-semiconductor bonding alloy containing boron as a p-type impurity, and to bond leads to semiconductor crystals therewith, thus utilizing the gold as a vehicle for injecting boron dopant into semiconductor crystals.

The above and other objects and advantages of this invention will be explained by or be made apparent from the following disclosure and the preferred embodiments as illustrated in the drawing, in which.

Figure 1:
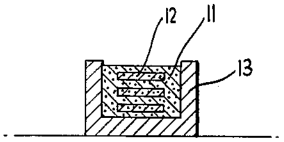
FIG. 1 illustrates the forming of a powder mixture from which the alloy is made.

Boron, in compound form, is not a type-determining impurity in semiconductor materials. The boron must enter the semiconductor crystal lattice as atomic boron. Thus alloys containing boron in compound form do not satisfy the requirements of semiconductor device fabrication unless the compound is dissociated and the boron released in an available, or active, form to the semiconductor crystal.

Gold will not dissolve boron at or near the melting temperature of gold or below the melting temperatures of germanium and silicon. According to this invention gold can be made to dissolve boron in substantial quantities by heating to temperatures in excess of the melting point of boron, as by arc-melting; and further, boron appears to form a solution with gold at such temperatures in a wide range of concentrations. Upon cooling and solidifying, the boron is rejected from the solution unless the cooling is so rapid as to trap a boron phase within the body of the solidified gold. PN junctions to n-type semiconductor materials, and ohmic contacts to p-type semiconductor materials, may be produced by dissolving boron in gold at very high temperatures, rapidly cooling the gold to trap a boron phase therein, and reheating the boron-gold alloy so produced adjacent a lead and a semiconductor crystal of proper type to form an alloy bond therebetween.

The present invention will be explained in connection with gold bonding of a silicon semiconductor crystal to a tab, or lead, with resulting injection of boron from the gold to the silicon crystal. A gold alloy with boron dispersed therein is initially formed by dissolving boron in gold at temperatures at which boron is soluble in gold, preferably well above the boron melting temperature, followed by rapid cooling of the melt on a water-cooled copper plate or crucible to avoid rejection of the boron on cooling. Thereafter the boron-gold alloy is formed to predetermined shapes, such as by mechanically cladding on to tab material and cutting tabs therefrom, and finally in a single bonding operation the boron-gold alloy is melted and fused to the tab and to the crystal. As will be brought out, additives may be used to improve the dispersion of the boron in the boron-gold alloy.

In attempts to add elemental or commercially pure boron to gold by adding the boron to molten gold, it was learned that the boron does not appear to wet molten gold at or near the melting temperature of gold or at temperatures which may be used for known semiconductor materials, even with prolonged exposure, and no appreciable alloying occurs. In accordance with this invention, a compact of gold powder and boron powder is formed; the compact is heated in a dry, nonoxidizing environment such as helium (to avoid oxidizing the boron), the compact being heated to a temperature at which boron melts and dissolves in gold in substantial quantities, and preferably well above the melting temperature of the boron, which is reported to be 2300° C. (±300° C.). The heating is preferably by electron beam heating, arc-melting, or consumable electrode melting. A melt is formed at a temperature above the melting point of boron, and upon rapid cooling a boron-gold alloy ingot is formed.

Although it is not yet certain why the wetting and consequent alloying of boron in molten gold occurs, it is presently believed that an oxide film on the boron has heretofore prevented wetting at high temperature, and a reducing solubility of boron in gold with lower temperatures has contributed to prior inability to form boron-gold alloys. Equilibrium data suggest that boron oxides should dissociate at very high temperatures and low dew points, such as temperatures in excess of about 1500° C. for dew points below about −60° C. This may explain the success in alloying in dry helium atmosphere under arc-melting and similar techniques.

In assembling the materials to make the boron-gold ingot, gold powder 11 and boron powder 12 are placed in a receptacle or die 13 as shown in FIG. 1 with the gold powder preferably surrounding the boron powder. A mixture of 99% gold powder and 1% boron powder is suitable but the boron powder constituent may vary widely from about 1 part per million to over 50%. One percent boron is ordinarily sufficient for semiconductor device fabrication.

Figure 2:
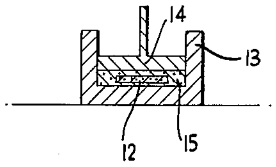
FIG. 2 illustrates the pressing of the mixture of FIG. 1 into a compact.

In FIG. 2 a ram 14 is schematically illustrated which presses the powder within the receptacle or die 13 to form a powder compact 15. In this assembly, with 99% gold in the compact, the ductile gold easily forms a box or container for the light, brittle boron powder. With mixtures containing in excess of 50% of boron powder it is difficult to maintain the coherent gold constituent about the boron in the compact 15.

Figure 3:
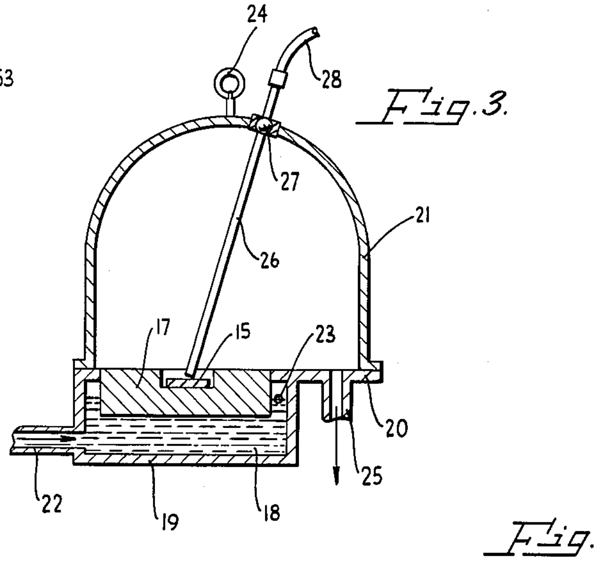
FIG. 3 illustrates arc melting and casting of an ingot from the compact of FIG. 2.

In FIG. 3 the campact 15 is placed in a recess within a copper crucible 17 which is water cooled by a stream of water 18 flowing between an outer shell 19 and the crucible 17. Water is supplied through inlet 22 and is discharged through outlet 23. A base plate 20, forming an extension of the crucible 17, serves as a base for a vacuum bell cover 21 which surrounds the recess of the plate 17. A water cooled electrode 26 is supported in a ball joint 27, the coolant water and power supply being delivered through conduits 28.

The compact 15 is fused or melted in the apparatus of FIG. 3 according to the following procedure. The compact is placed within a recess of the crucible base plate 17 and the bell cover 21 is put in place on the base 20 by a lifting ring 24. The bell cover is evacuated through exhaust 25 and back-purged with dry helium gas to remove or dilute traces of moisture and oxygen containing gas. An arc is then struck by the electrode 26 through the compact 15 to produce sufficient heat within the compact to raise it above the melting point of boron, i.e., above 2300° C. The water cooled base plate 17 serves as a ground for the arc which heats the compact. It is ordinarily necessary to produce repeated or continuous arcs before the entire compact has been properly fused, and it is sometimes desirable to turn the compact over and strike arcs from the opposing side to complete the fusing process. By moving the arc across the melt during fusion, improved mixing and dispersion of the boron in the gold is obtained. A properly fused compact will contain substantially no voids from the original powder compact. The product of this fusing process is thoroughly cooled before removing it from the atmosphere bell 21 to avoid excess oxidation of its boron constituent.

Figure 6:
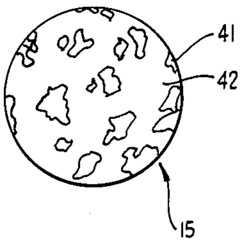
FIG. 6 represents a photomicrograph of a boron-gold alloy produced according to this invention.

It has been observed that at arc-melting temperatures, and under proper inert atmosphere, there is no apparent difficulty in dissolving boron in gold. The melt has been maintained for extended periods of time with no apparent rejection of boron at the high melting temperatures. However, if the melt is allowed to cool slowly the boron appears to be rejected to the surface of the ingot formed, where it is not satisfactorily available for device fabrication. A properly quenched, or rapidly cooled, ingot of 1% boron in gold which has been cast from an arc-melted powder compact and cooled by contact with the water-cooled plate 17 is shown by a photomicrograph as represented in FIG. 6, to contain a boron phase 41 in a gold matrix phase 42 in which the boron particle size averages about one mil diameter and is quite uniform in szie and uniformly dispersed.

Figure 4:
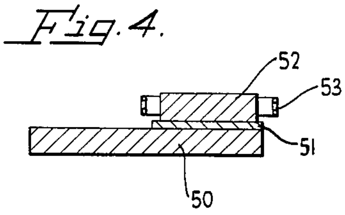
FIG. 4 is a schematic assembly for a semiconductor bonding operation utilizing a boron-gold alloy clad tab.

The boron phase appears to be quite brittle, but the alloy may be satisfactorily worked to thicknesses of the order of one mil for semiconductor device fabrication. For example, a 50 gram ingot of 1% boron arc-melted and cast from a powder compact as herein described is rolled into foil, clad by rolling to a conventional tab material of nickel iron, cut to bits, or special shapes, and assembled with semiconductor dice as shown in FIG. 4, wherein a tab 50 with a boron-gold alloy 51 clad thereto is assembled with a p-type silicon die 52, and the assembly is heated by a heating coil 53 to fuse the gold onto the tab and the die, thus making an ohmic contact to the semiconductor die 52.

Figure 5:
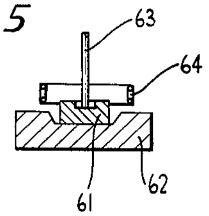
FIG. 5 is a schematic assembly of a semiconductor bonding and junction forming operation utilizing a boron-gold alloy pellet.

Alternatively, as shown in FIG. 5, the boron-gold alloy is mechanically preformed into round shapes 61, and a preformed shape 61 is placed in a recess formed in an n-type silicon die 62. A lead 63 is inserted into the preform 61, and the assembly is heated by a heating coil 64 to fuse the boron-gold alloy, dissolve a portion of the silicon crystal, and upon cooling recrystalize to form a p-type region between the lead 63 and the n-type body of the crystal, thus forming a rectifying contact to the crystal, or a p-n junction.

It will be appreciated that the fineness of dispersion of the boron phase of the boron-gold alloy, and its uniformity of dispersion, will affect its usefulness both in forming operations and in fusing operations. It has been found that certain materials may be added to the powder, when forming the "green" powder compact 15 (or to the gold material), which cause the boron phase to be more uniformly dispersed and to form smaller particle sizes.

Figure 7:
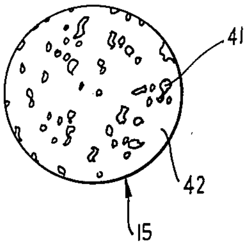
FIG. 7 represents a photomicrograph of a boron-gold alloy with cerium additive for dispersing the boron particles.

FIG. 7 represents a photomicrograph taken of a boron-gold alloy formed with 1% boron and 1/10% cerium powders in the original powder compact. The maximum boron phase 41 particle size was somewhat less than one half mil, and smaller-sized boron phase particles were dispersed throughout the matrix 42. This is an improved alloy over the straight 1% boron of FIG. 6.

Figure 8:
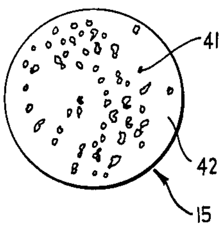
FIG. 8 represents a photomicrograph of a boron-gold alloy with an yttrium additive for dispersing the boron particles.

FIG. 8 represents a photomicrograph of a boron-gold alloy made from a powder compact containing the 1% boron with 1/10% yttrium added. This produced a yet more uniform boron phase 41 particle size, generally less than one-quarter mil diameter, as well as a more uniform dispersion of the boron phase particles. This alloy is superior to those of FIGS. 6 and 7.

This invention has been explained in connection with arc melting boron-gold alloys and fabricating silicon semiconductor devices therefrom. As noted in "Constitution of Binary Alloys," boron does not normally wet or alloy with gold, but when handled as herein described a boron-gold alloy bonding material may be produced for semiconductor device fabrication, and used in forming ohmic and rectifying junctions with semiconductor materials such as silicon and germanium.

What is claimed is:

1. The method of doping semiconductor material of the class consisting of silicon and germanium with boron, which comprises: forming a mixture of boron and gold; dissolving the boron into the gold by heating the mixture to temperatures at which boron is soluble in said gold; cooling said solution of boron in said gold to form an alloy having a boron phase dispersed in a matrix of said gold; reheating said alloy in contact with semiconductor material to a temperature sufficient to dissolve semiconductor material therein; and cooling to recrystallize semiconductor material with boron injected thereinto from said alloy as a dopant.

2. The method according to claim 1 wherein said mixture contains from about 1 part per million to over 50% boron.

3. The method according to claim 1 wherein said mixture contains cerium to improve the dispersion of boron in the gold.

4. The method according to claim 1 wherein said mixture contains yttrium to improve the dispersion of boron in the gold.

5. The method of joining an electrically conducting lead to a semiconductor device, which comprises: heating an assembly of an electrically conducting lead, a semiconductor device of a material of the class consisting of silicon and germanium, an an alloy of boron in gold to melt said alloy in wetting contact with said lead and said device; and cooling said assembly.

6. The method of joining an electrically conducting lead to semiconductor material of the class consisting of silicon and germanium which comprises: forming a bonding alloy of boron in gold by fusing a mixture thereof at elevated temperature whereat the gold dissolves the boron, and cooling said fused mixture to form a bonding alloy having a boron phase dispersed in a gold matrix phase; assembling an electrically conducting lead, semiconductor material of the class consisting of silicon and germanium, and a quantity of said bonding alloy; heating said assembly to a temperature above the melting temperature of said bonding alloy to fuse said alloy to said semiconductor material; and cooling said assembly to bond said lead to said semiconductor material.

7. The method of joining an electrically conducting lead to a semiconductor device, which comprises: heating an assembly of an electrically conducting lead, a semiconductor device of a material of the class consisting of silicon and germanium, and an alloy of boron in gold containing a boron phase dispersing agent of the class consisting of cerium and yttrium to melt said alloy in wetting contact with the lead and the device; and cool the assembly.

References Cited by the Examiner

UNITED STATES PATENTS

| | | | |
|---|---|---|---|
| 1,577,995 | 3/26 | Wise | 75—165 |
| 2,556,921 | 6/51 | Hirsch | 75—165 |
| 2,596,454 | 5/52 | Williams | 75—165 |
| 2,701,326 | 2/55 | Pfann | 148—1.5 |
| 2,736,847 | 2/56 | Barnes | 148—1.5 |
| 2,780,543 | 2/57 | Schneider et al. | 75—165 |
| 2,789,068 | 4/57 | Maserjian | 148—1.5 |
| 2,829,999 | 4/58 | Gudmundsen | 148—1.5 X |
| 2,937,114 | 5/60 | Shockley | 148—33 |
| 2,937,962 | 5/60 | Kitchens | 148—33 |
| 2,947,925 | 8/60 | Maynard et al. | 148—1.5 |
| 2,985,550 | 5/61 | Anderson | 148—1.5 |
| 2,992,947 | 7/61 | Gotzberger | 148—1.5 |
| 3,009,840 | 11/61 | Emeis | 148—1.5 |
| 3,068,127 | 12/62 | Patalong et al. | 148—1.5 |

FOREIGN PATENTS

| | | |
|---|---|---|
| 714,965 | 9/54 | Great Britain. |

DAVID L. RECK, *Primary Examiner.*

MARCUS U. LYONS, RAY K. WINDHAM, *Examiners.*